(12) United States Patent
Balar et al.

(10) Patent No.: US 10,972,113 B1
(45) Date of Patent: Apr. 6, 2021

(54) SYSTEMS WITH ADC CIRCUITRY AND ASSOCIATED METHODS

(71) Applicant: SEMICONDUCTOR COMPONENTS INDUSTRIES, LLC, Phoenix, AZ (US)

(72) Inventors: Bharat Balar, Bengaluru (IN); Parthasarthy V Sampath, Bangalore (IN)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 16/802,757

(22) Filed: Feb. 27, 2020

(30) Foreign Application Priority Data

Dec. 31, 2019 (IN) .............................. 201911054641

(51) Int. Cl.
*H03M 1/00* (2006.01)
*H03F 3/68* (2006.01)
(Continued)

(52) U.S. Cl.
CPC ............... *H03M 1/002* (2013.01); *G01S 7/03* (2013.01); *H03F 3/193* (2013.01); *H03F 3/45636* (2013.01); *H03F 3/68* (2013.01)

(58) Field of Classification Search
CPC .......... H03M 1/002; H03F 3/193; H03F 3/68; H03F 3/45636
(Continued)

(56) References Cited

U.S. PATENT DOCUMENTS

| 5,847,600 A | * | 12/1998 | Brooks | ................... H03F 3/005 330/9 |
| 6,031,480 A | * | 2/2000 | Soenen | ............... H03F 3/45479 330/9 |

(Continued)

OTHER PUBLICATIONS

Ryu et al., "A 10-bit 50-MS/s Pipelined ADC With Opamp Current Reuse," IEEE Journal of Solid-State Circuits, vol. 42, No. 3, Mar. 2007, pp. 475-485.
(Continued)

*Primary Examiner* — Lam T Mai
(74) *Attorney, Agent, or Firm* — Treyz Law Group, P.C.; Tianyi He

(57) ABSTRACT

Systems with object detection capabilities may include a radio detection and ranging (RADAR) system. The RADAR system or other portions of the systems may include analog-to-digital converter circuitry. The analog-to-digital converter circuitry may be implemented as pipeline analog-to-digital converter circuitry having multiple stages. Each stage may include multiplying digital-to-analog converter circuitry having a sampling network and amplifier circuitry. The amplifier circuitry may be shared be shared between multiple stages. The amplifier circuitry may include cascodes for switching between different input pairs from corresponding sampling networks in corresponding stages. The amplifier circuitry may generate amplifier outputs for a first sampling network while the other sampling network performs sampling operations. This may minimize non-amplification time for the amplifier circuitry reduce power consumption in the converter circuitry. The amplifier circuitry may also include shorting switches that bring the amplifier output to a common mode voltage to more improve output slew characteristics.

20 Claims, 9 Drawing Sheets

(51) Int. Cl.
*H03F 3/45* (2006.01)
*G01S 7/03* (2006.01)
*H03F 3/193* (2006.01)

(58) Field of Classification Search
USPC ............... 341/130–155; 330/9, 51, 253, 311
See application file for complete search history.

(56) References Cited

U.S. PATENT DOCUMENTS

| | | | | |
|---|---|---|---|---|
| 6,486,820 | B1* | 11/2002 | Allworth | H03F 1/0277 |
| | | | | 341/155 |
| 6,577,185 | B1* | 6/2003 | Chandler | H03F 1/0277 |
| | | | | 330/133 |
| 7,148,833 | B1* | 12/2006 | Cho | H03M 1/0607 |
| | | | | 341/162 |
| 7,408,496 | B2* | 8/2008 | Cho | H03F 3/005 |
| | | | | 341/161 |
| 8,686,888 | B2* | 4/2014 | Chou | H03F 3/265 |
| | | | | 341/161 |
| 2005/0219101 | A1* | 10/2005 | Kurose | H03M 1/123 |
| | | | | 341/155 |
| 2007/0090987 | A1* | 4/2007 | Cho | H03M 1/0607 |
| | | | | 341/161 |
| 2007/0290915 | A1* | 12/2007 | Morimoto | H03M 1/0695 |
| | | | | 341/161 |
| 2008/0042890 | A1* | 2/2008 | Cho | H03F 3/45475 |
| | | | | 341/161 |
| 2008/0068237 | A1* | 3/2008 | Jeon | H03M 1/1225 |
| | | | | 341/122 |
| 2009/0072899 | A1* | 3/2009 | Cho | H03M 1/0607 |
| | | | | 330/147 |
| 2009/0289821 | A1* | 11/2009 | Li | H03M 1/1205 |
| | | | | 341/110 |
| 2012/0112939 | A1* | 5/2012 | Miki | H03M 1/1057 |
| | | | | 341/118 |

OTHER PUBLICATIONS

Chandrashekar et al., "A 10 b 50 MS/s Opamp-Sharing Pipeline A/D With Current-Reuse OTAs," IEEE Transactions on Very Large Scale Integration (VLSI) Systems, vol. 19, No. 9, Sep. 2011, pp. 1610-1616.

* cited by examiner

SYSTEMS WITH ADC CIRCUITRY AND ASSOCIATED METHODS

This application claims the benefit of and claims priority to Indian Patent Application No. 201911054641, filed Dec. 31, 2019, which is hereby incorporated by reference in its entirety.

BACKGROUND

This relates generally to amplifier circuitry and analog-to-digital converter (ADC) circuitry, and more specifically, to radio detection and ranging (RADAR) systems having ADC circuitry with amplifier circuitry, and to the associated methods.

Modern object detection systems can use RADAR systems to detect range, angle, and velocity of objects. These systems can include corresponding circuits operating in an analog domain or a digital domain. To bridge communications between the two domains, these systems can include analog-to-digital converter circuitry. In particular, a RADAR system can include receiver circuitry that uses ADC circuitry such as a pipeline ADC for medium/high speed and resolution applications in converting analog signals to digital data.

Pipeline ADCs typically include multiplying digital-to-analog converter (MDAC) stages. It can be difficult to design MDAC stages with minimized power consumption while providing satisfactory performance. As an example, amplifier circuitry in the MDAC stages can consume large amounts of power by being powered on during sampling periods, during which the amplifier circuitry is not used. While the amplifier circuitry can selectively be turned on only when being used, the time for turning the amplifier circuitry on undesirably adds dead time that takes away available time for signal settling. Compensating for the reduced signal settling time diminishes the actual power saving from turning the amplifier circuitry off.

It would therefore be desirable to provide systems having improved amplifier circuitry, especially improved amplifier circuitry in MDAC stages for pipeline ADCs, with reduced power consumption and satisfactory performance.

DETAILED DESCRIPTION

Embodiments of the present invention relate to systems with amplifier circuitry and/or ADC circuitry, and more particularly to an operational transconductance amplifier (OTA) sharing MDAC design using cascodes as switching circuitry for a pipeline ADC. If desired, the systems and methods in the present embodiments may be implemented in any suitable system such as a RADAR system. It will be recognized by one skilled in the art, that the present exemplary embodiments may be practiced without some or all of these specific details. In other instances, well-known operations have not been described in detail in order not to unnecessarily obscure the present embodiments.

The amplifier circuitry (e.g., OTA circuitry), the MDAC circuitry (e.g., MDAC stages having respective sampling networks), and the ADC circuitry (e.g., pipeline ADC circuitry) described herein may be generally implemented to perform shared amplification operations, to perform shared amplification operations in MDAC circuitry, to perform shared amplification operations in MDAC stages in the ADC circuitry, etc. As examples, the amplifier, MDAC, and ADC circuitry, and the associated systems and methods described herein may be implemented, separately or in combination, as part of any electronic device such as a portable electronic device, a camera, a tablet computer, a desktop computers, a webcam, a cellular telephone, a video camera, a video surveillance system, an automotive imaging system, a video gaming system, a RADAR system, or any other electronic device that may include or exclude imaging capabilities. The amplifier circuitry, MDAC circuitry, and ADC circuitry, and associated systems and methods being implemented as part of a RADAR system or an electronic system having object detection capabilities is described in detail herein as an example. However, this particular example is merely illustrative. If desired, the amplifier, MDAC, and ADC circuitry, and the associated systems and methods may be implemented in any of the above-mentioned systems or any other suitable systems.

Figure 1:
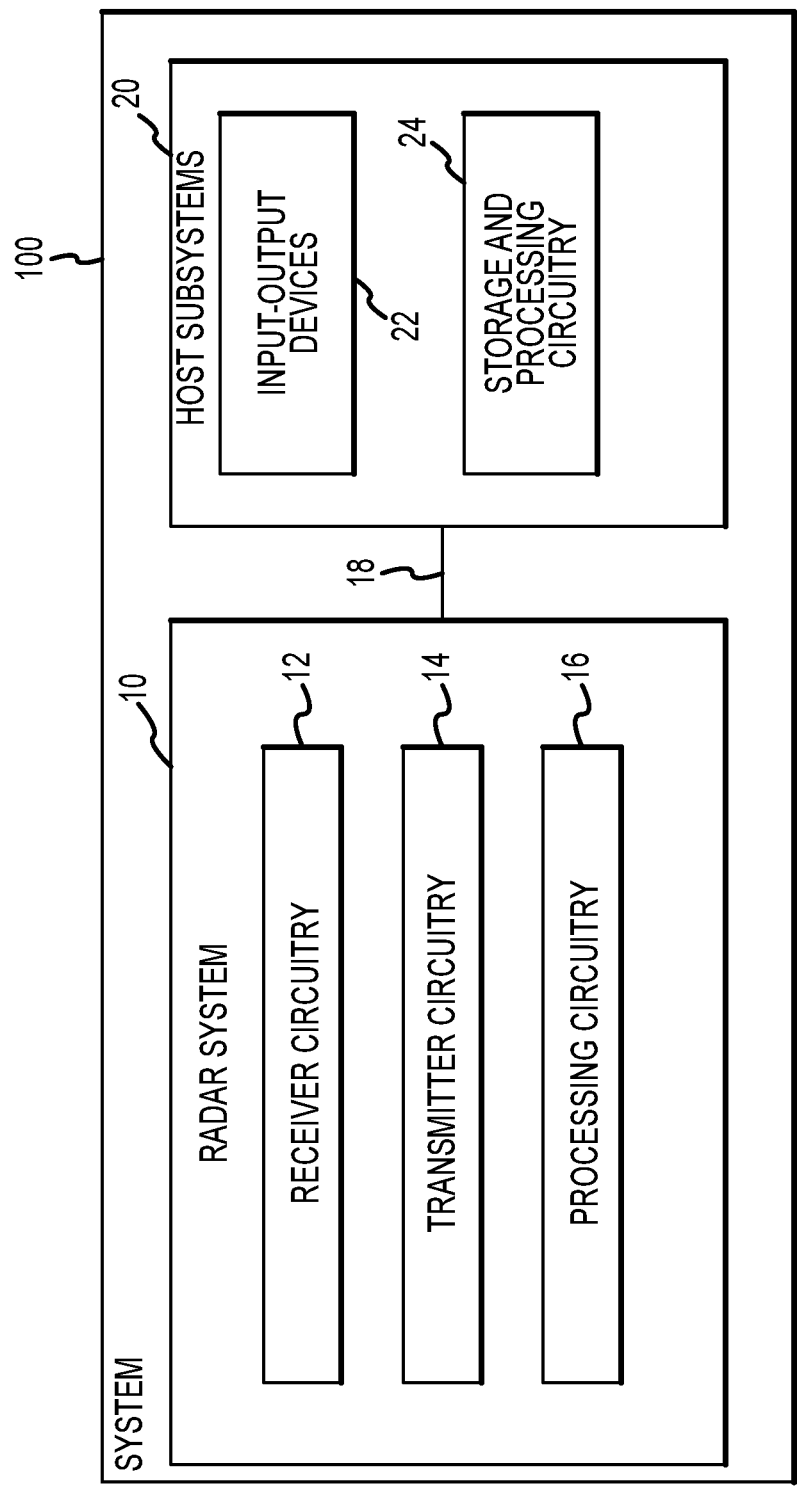
FIG. 1 is a diagram of an illustrative electronic system having a RADAR system in accordance with some embodiments.

FIG. 1 is a diagram of an illustrative electronic system including a radio detection and ranging (RADAR) system that uses radio waves to perform object detection (e.g., by determining the range, angle, velocity, or other characteristics of objects in an environment). System 100 of FIG. 1 may be an electronic device such as a camera, a cellular telephone, a video camera, or other electronic device that captures digital image data, may be a vehicle safety system (e.g., an active braking system or other vehicle safety system), may be an object detection system (e.g., a RADAR-based system), may be a surveillance system, or may be any other suitable system.

As shown in FIG. 1, system 100 may include a RADAR system such as RADAR system 10 and host subsystems such as host subsystem 20. RADAR system 10 may include receiver circuitry 12, transmitter circuitry 14, and processing circuitry 16. Processing circuitry 16 may include baseband circuitry, signal generation circuitry, signal processing circuitry, or other types of circuitry (e.g., other types of circuitry for supporting the transmission and reception of antenna signals using receiver circuitry 12 and transmitter circuitry 14, other types of circuitry for supporting object detection operations, etc.).

Processing circuitry 16 may provide signals over transmitting signal paths to transmitter circuitry 14 for transmitting the signals (e.g., radio-frequency antenna signals) over antennas. Processing circuitry 16 may also receive signals over receiving signal paths from receiver circuitry 16 for receiving the signals using antennas. Based on the transmitted signals and the received signals the processing circuitry 16 may perform object detection operations (e.g., RADAR-based operations) and generate the corresponding data for further processing and/or storage.

RADAR system 10 (e.g., processing circuitry 16) may convey generated data to host subsystem 20 over path 18. Host subsystem 20 may include processing software instructions for further identifying or detecting objects in the environment, for detecting motion of objects relative to other objects, for determining distances to objects, for filtering or otherwise processing the generated data provided by RADAR system 10.

If desired, system 100 may provide a user with numerous high-level functions. In a computer or advanced automotive system, for example, a user may be provided with the ability to run user applications. To implement these functions, host subsystem 20 of system 100 may have input-output devices 22 such as keypads, input-output ports, joysticks, and displays and storage and processing circuitry 24. Storage and processing circuitry 24 may include volatile and nonvolatile memory (e.g., random-access memory, flash memory, hard drives, solid-state drives, etc.). Storage and processing circuitry 24 may also include microprocessors, microcontrollers, digital signal processors, application specific integrated circuits, etc.

Figure 2:
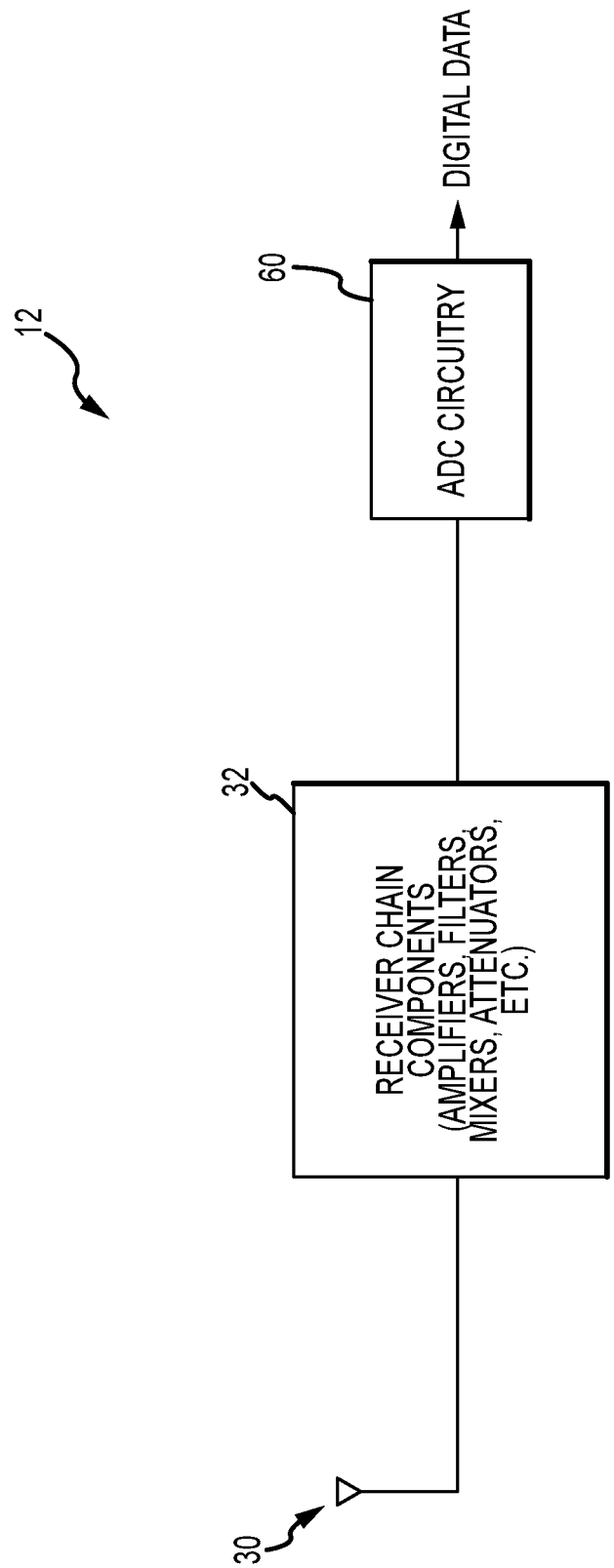
FIG. 2 is a diagram of illustrative receiver chain circuitry for processing received antenna signals in accordance with some embodiments.

FIG. 2 is a diagram of circuitry on a receiver chain path for receiver circuitry such as receiver circuitry 12 in FIG. 1. In particular, receiver circuitry 12 may include antenna circuitry 30 (e.g., one or more antennas having antenna resonating elements, antenna tuning elements, etc.). Antenna circuitry 30 may be coupled to processing circuitry (e.g., a baseband processor of processing circuitry in FIG. 1) via one or more receiver chain path.

Receiver chain components such as receiver chain components 32 may be interposed along the receiver chain path. In particular, receiver chain components may include amplifier circuitry, filter circuitry, mixer circuitry, attenuator circuitry, and other types of signal processing circuitry. In a particular, example, the radio-frequency signals received by antenna circuitry 30 may pass through a low-noise amplifier, and subsequently, a mixer. The mixer may down-convert the frequency of the received signal to a signal having an intermediate frequency. The signal having the intermediate frequency may thereafter pass through a series of filters (e.g., high-pass filters, low-pass filters, and/or band-pass filters) and amplifiers to remove any undesired noise and improve signal quality. This is merely illustrative. If desired, other suitable operations may be performed on the signal received by antenna circuitry 30. The final processed antenna signal may be output from receiver chain components 32 (e.g., a last component in the series of receiver chain components) to downstream circuitry.

To convert analog antenna-based signals such as antenna signals after passing through receiver chain components 32, receiver circuitry 12 (e.g., the receiver chain path in receiver circuitry 12) may include ADC circuitry such as ADC circuitry 60. ADC circuitry 60 may generate digital data based on the analog signals and provide the digital data to processing circuitry 16 (FIG. 1). If desired, ADC circuitry 60 may also be included in any other suitable portion of system 100 in FIG. 1 (e.g., may be included in other portions of RADAR system 10 and/or in host subsystems 20 in FIG. 1).

Figure 3:
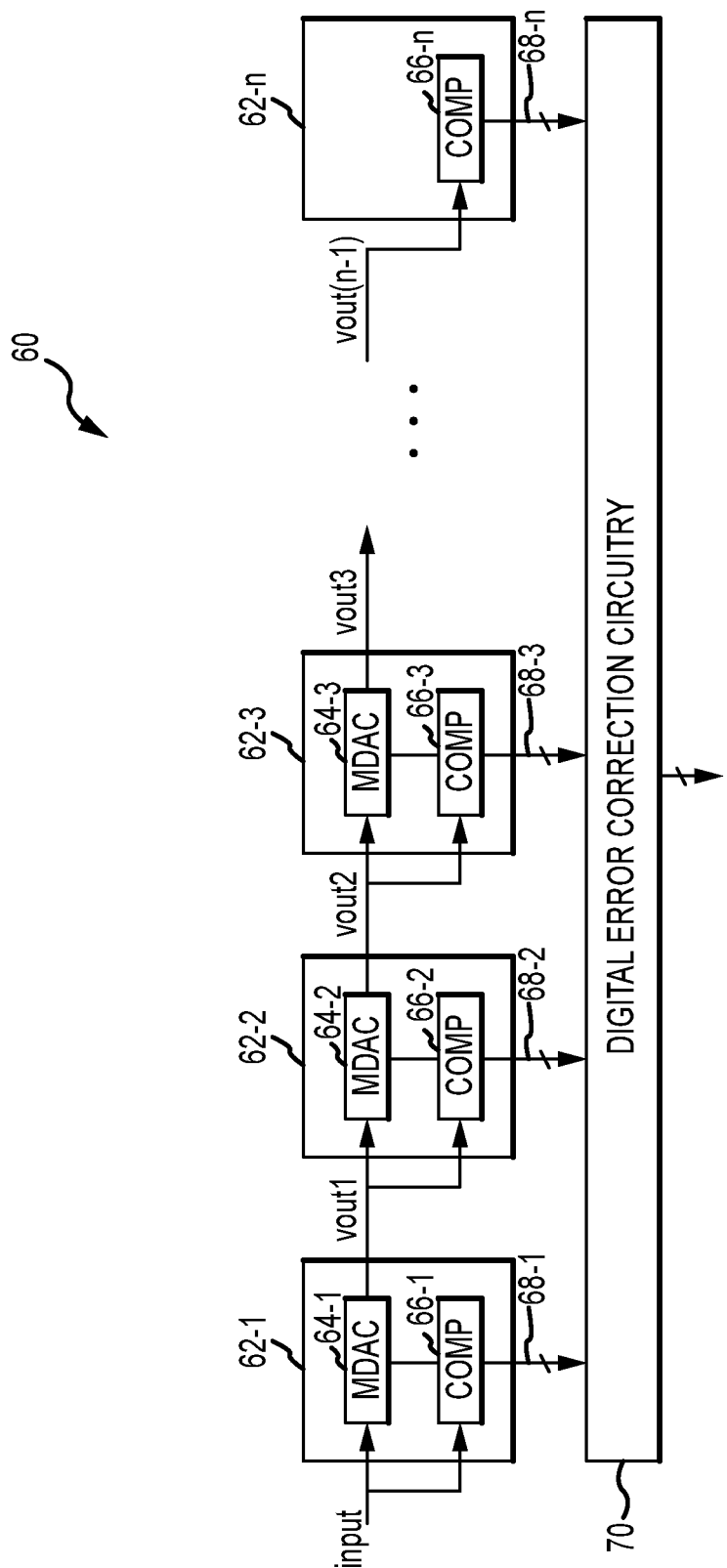
FIG. 3 is a diagram of illustrative pipeline ADC circuitry in accordance with some embodiments.

FIG. 3 is a block diagram of illustrative ADC circuitry 60. As an example, ADC circuitry 60 may be pipeline ADC circuitry having multiple stages. As shown in FIG. 3, ADC circuitry 60 may include n stages 62-1, 62-2, 62-3, . . . , 62-n. Each stage 62, with the exception of the last stage 62-n, may include corresponding MDAC circuitry 64 and comparator circuitry 66, while the last stage 62-n may include comparator circuitry 66-n but may omit the corresponding MDAC circuitry 64 (or may have unused MDAC circuitry). Each corresponding MDAC circuitry 64 in stages 62 may pass signals to a subsequent stage, thereby creating a pipeline path. Stages 62 may therefore sometimes be referred to herein as MDAC stages 62.

ADC circuitry 60 may include any suitable number of MDAC stages 62. Stages 62 may perform conversion operations to resolve corresponding sets of bits (e.g., one bit, one-and-a-half bits, two bits, two-and-a-half bits, etc.), the combination of which are used to generate the final digital data. In particular, MDAC circuitry 64-1 and comparator circuitry 66-1 in first stage 62-1 may receive an analog input signal vinput. Comparator 66-1 may resolve a first set of bits such as a set of most significant bits (e.g., a single bit, one-and-a-half bits, two bits, two-and-a-half bits, three bits, more than three bits, etc.). The first set of bits may include a portion of fully resolved bits and a portion of partially resolved bits (e.g., an overlap bit). Comparator 66-1 may provide the resolved first set of bits over path 68-1. Comparator 66-1 may also provide the resolved first set of bits to MDAC circuitry 62-1. MDAC circuitry 62-1 may covert the resolved first set of bits to an analog-equivalent signal and subtract the analog-equivalent signal associated with the first set of bits from the input analog signal vinput. The difference signal (e.g., between the analog-equivalent signal and the input analog signal vinput) may be amplified and provided to the next stage (e.g., stage 62-2) as signal vout1.

Based on input signal vout1, comparator circuitry 66-2 in stage 62-2 may generate a second set of bits that are output over path 68-2. MDAC circuitry 64-2 may convert the second set of bits to an analog-equivalent signal and subtract the analog-equivalent signal associated with the second set of bits form the input signal of stage 62-2 (e.g., signal vout1). The difference signal (e.g., between the analog-equivalent signal and the input signal of stage 62-2 vout1) may be amplified and provided to the next stage (e.g., stage 63-3) as signal vout2. In a similar manner, stage 62-3, 62-4, . . . , 62-n may output corresponding sets of bits over corresponding paths 68 and send corresponding output analog signal to the immediately subsequent stage if not the last stage (e.g., stage 62-n may output a corresponding set of bits such as the least significant bits over path 68-n but may omit passing an analog signal for a subsequent stage).

ADC circuitry 60 may include digital error correction circuitry 70. Digital error correction circuitry 70 may receive corresponding sets of bits resolved by stages 62 over paths 68. Digital error correction circuitry 70 generate the converted final digital data based on the received sets of bits (e.g., by resolving overlapping bits between different stages or by performing any other suitable processing operations).

Figure 4A:
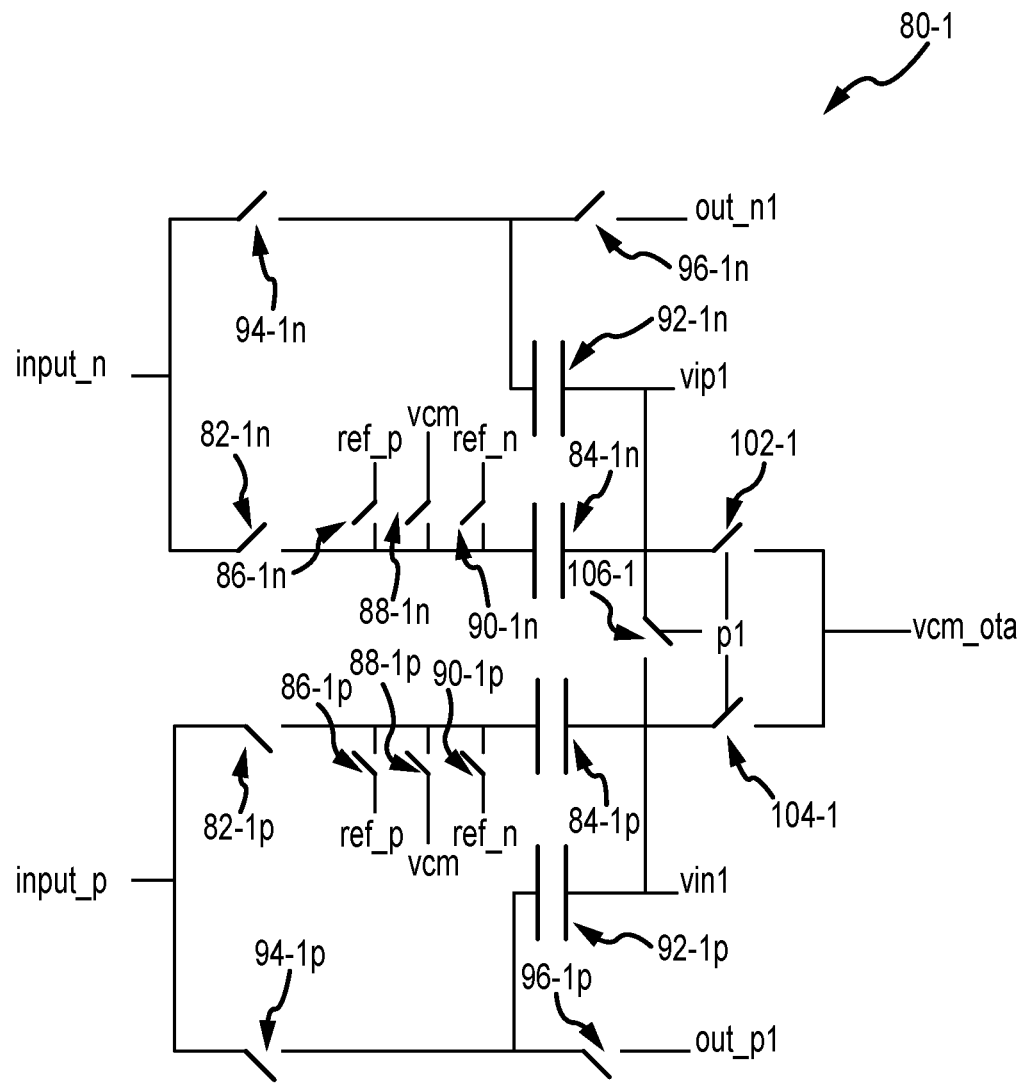
FIGS. 4A and 4B are diagrams of two illustrative (switch cap) sampling networks in two corresponding MDAC stages, each receiving an input pair, in accordance with some embodiments.
Figure 4B:
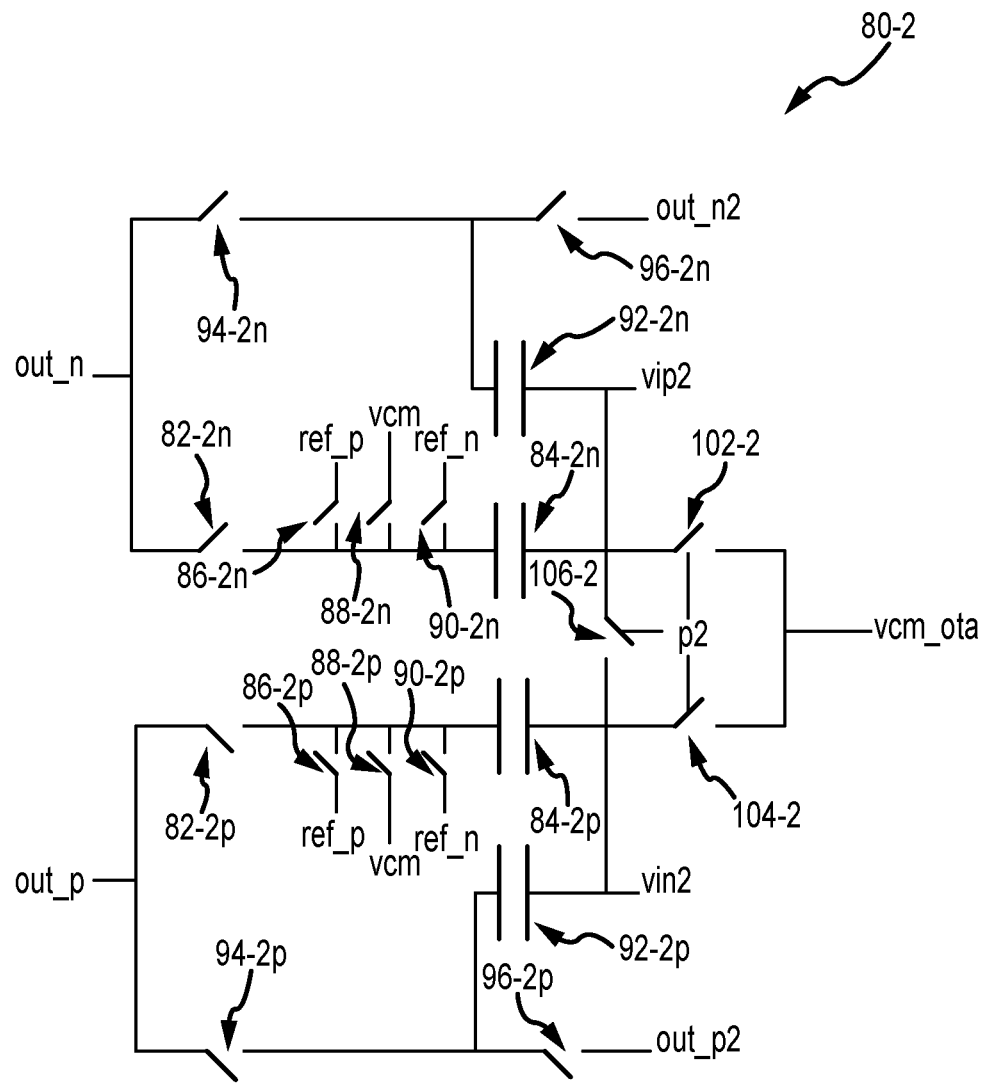

FIGS. 4A and 4B are diagrams of illustrative sampling networks for two different stages in ADC circuitry such as ADC circuitry 60 in FIG. 3. As an example, sampling network 80-1 (sometimes referred to herein as a capacitive network and a capacitive sampling network) may be implemented within stage 62-1 in FIG. 3. As shown in FIG. 4A, sampling network 80-1 may receive inputs signals input_n and input_p at corresponding input terminals in sampling network 80-1 (e.g., signal vinput in FIG. 3 may be received as differential signal voltages input_n and input_p).

Sampling network 80-1 may include capacitors 84-1n, 92-1n, 84-1p, and 92-1p for sampling the differential input signals. Switch 82-1n may connect the input terminal for signal input_n to capacitor 84-1n, and switch 94-1n may connect the input terminal for signal input_n to capacitor 92-1n. Switch 82-1p may connect the input terminal for signal input_p to capacitor 84-1p, and switch 94-1p may connect the input terminal for signal input_p to capacitor 92-1p. Switches 86-1n, 88-1n, and 90-1n may electrically connect reference voltages ref_p, vcm, and ref_n, respectively, to the path between switch 82-1n and capacitor 84-1n. Switches 86-1p, 88-1p, and 90-1p may electrically connect reference voltages ref_p, vcm, and ref_n, respectively, to the path between switch 82-1p and capacitor 84-1p. Switches 86-1n, 88-1n, 90-1n, 86-1p, 88-1p, and 90-1p may be used to selectively couple one or more desired voltages (e.g., voltages ref_p, vcm, and ref_n) to modify the sampled input signals input_n and input_p. As an example, switches 86-1n, 88-1n, 90-1n, 86-1p, 88-1p, and 90-1p may be used to perform the residue amplification operations described herein.

Capacitors 84-1n and 92-1n may each have a first terminal electrically connected to the input terminal for signal input_n and a second terminal electrically connected to an output terminal of sampling network 80-1 for signal vip1. Similarly, capacitors 84-1p and 92-1p may each have a first terminal electrically connected to the input terminal for signal input_p and a second terminal electrically connected to an output terminal of sampling network 80-1 for signal vin1. Signals vip1 and vin1 may be provided to amplifier circuitry before being sent to the next stage (e.g., stage 62-2 in ADC circuitry 60 in FIG. 3). Switches 102-1, 104-1, and 106-1 may electrically connect the output terminal for signal vip1, the output terminal for signal vin1, and an amplifier common mode voltage terminal (e.g., supplying voltage vcm_ota).

If desired, sampling network 80-1 may include switch 96-1n connecting the input terminal for signal input_n to output terminal for signal out_n1 (via switch 94-1n). If desired, sampling network 80-1 may include switch 96-1p connecting input terminal input_p to output terminal for signal out_p1. If desired, signals out_n1 and out_p1 (e.g., signals input_n and input_p) may be provided to the next stage by bypassing the amplifier circuitry input terminals for signals vip1 and vin1.

As an example, sampling network 80-2 may be implemented within stage 62-2 in FIG. 3. As shown in FIG. 4A, sampling network 80-2 may receive inputs signals out_n and out_p at corresponding input terminals in sampling network 80-2 (e.g., signal vout1 in FIG. 3 may be received as differential input signal voltages out_n and out_p). In particular, signals out_n and out_p may be generated based on signals vip1 and vin1 (e.g., based on amplified version of vip1 and vin1 after passing through the amplifier circuitry). If desired, signals out_n and out_p may be signals generated based on signals input_n and input_p through output terminals for signals out_n1 and out_p1 (in FIG. 4A).

Sampling network 80-2 may include capacitors 84-2n, 92-2n, 84-2p, and 92-2p for sampling the differential input signals. Switch 82-2n may connect the input terminal for signal out_n to capacitor 84-2n, and switch 94-2n may connect the input terminal for signal out_n to capacitor 92-2n. Switch 82-2p may connect the input terminal for signal out_p to capacitor 84-2p, and switch 94-2p may connect the input terminal for signal out_p to capacitor 92-2p. Switches 86-2n, 88-2n, and 90-2n may electrically connect reference voltages ref_p, vcm, and ref_n, respectively, to the path between switch 82-2n and capacitor 84-2n. Switches 86-2p, 88-2p, and 90-2p may electrically connect reference voltages ref_p, vcm, and ref_n, respectively, to the path between switch 82-2p and capacitor 84-2p. Switches 86-2n, 88-2n, 90-2n, 86-2p, 88-2p, and 90-2p may be used to selectively couple one or more desired voltages (e.g., voltages ref_p, vcm, and ref_n) to modify the sampled input signals out_n and out_p. As an example, switches 86-2n, 88-2n, 90-2n, 86-2p, 88-2p, and 90-2p may be used to perform the subtraction operations described in connection with FIG. 3 (e.g., the subtraction operation of the signal from comparator circuitry 66-2 from signal vout1 in MDAC circuitry 64-2).

Capacitors 84-2n and 92-2n may each have a first terminal electrically connected to the input terminal for signal out_n and a second terminal electrically connected to an output terminal of sampling network 80-2 for signal vip2. Similarly, capacitors 84-2p and 92-2p may each have a first terminal electrically connected to the input terminal for signal out_p and a second terminal electrically connected to an output terminal of sampling network 80-2 for signal vin2. Signals vip2 and vin2 may be provided to amplifier circuitry before being sent to the next stage (e.g., stage 62-3 in ADC circuitry 60 in FIG. 3). Switches 102-2, 104-2, and 106-2 may electrically connect the output terminal for signal vip2, the output terminal for signal vin2, and an amplifier common mode voltage terminal (e.g., supplying with voltage vcm_ota).

If desired, sampling network 80-2 may include switch 96-2n connecting the input terminal for signal out_n to output terminal for signal out_n2 (via switch 94-2n). If desired, sampling network 80-2 may include switch 96-2p connecting input terminal out_p to output terminal for signal out_p2. If desired, signals out_n2 and out_p2 (e.g., signals out_n and out_p) may be provided to the next stage by bypassing the amplifier circuitry input terminals for signals vip2 and vin2.

Each stage of MDAC circuitry 64 in FIG. 3 may include amplifier circuitry such as an operational transconductance amplifier (OTA) circuitry. In the example of sampling network 80-1 in FIG. 4A being implemented as part of MDAC circuitry 64-1 in stage 62-1 in FIG. 3, the amplifier circuitry in MDAC circuitry 64-1 may receive as inputs signals vip1 and vin1 in FIG. 4A. The output of the amplifier circuitry in MDAC circuitry 64-1 in FIG. 3 may generate (using signals vip1 and vin1 in FIG. 4A as inputs) output signals out_n and out_p that are inputs to sampling network 80-2 in FIG. 4B.

In particular, MDAC circuitry 64 in each stage may operate in a sampling mode and an amplification mode (sometimes referred to herein as a sampling phase and an amplification phase). During the sampling mode, MDAC circuitry 64 may sample an input signal into a capacitive network of that stage (e.g., sampling network 80-1 in FIG. 4A or sampling network 80-2 in FIG. 4B). If desired, the sampled signal may be modified in the capacitive network (e.g., by applying different reference voltages such as voltages ref_p, vcm, and ref_n). During the amplification mode, the sampled signal is passed into the amplifier circuitry and amplified. As such, during the sampling mode of operation, the amplifier circuitry of that stage is idling and undesirably consuming excess power.

Figure 5:
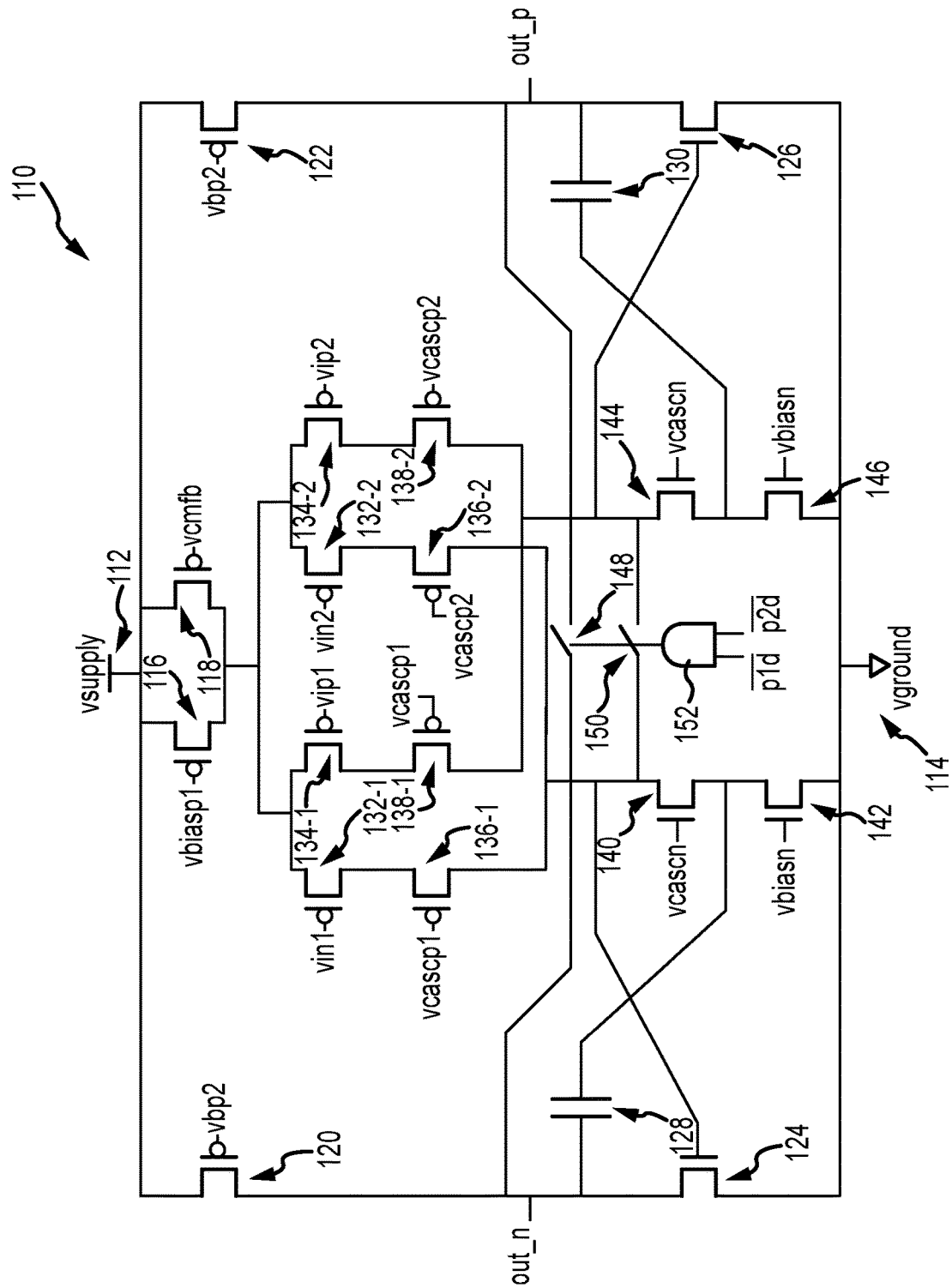
FIG. 5 is a diagram of illustrative (operational) amplifier circuitry that uses cascodes as switching circuitry and that is shared between multiple sampling networks such as sampling networks of the type shown in FIGS. 4A and 4B in accordance some embodiments.

To improve the power efficiency of the amplifier circuitry in MDAC stages for ADC circuitry such as ADC circuitry in FIG. 3, multiple sampling networks may be coupled to shared amplifier circuitry. FIG. 5 shows illustrative amplifier circuitry (e.g., amplifier circuitry 110) shared between different sampling networks (e.g., configured to receive as input signals from multiple sampling networks such as sampling network 80-1 in FIG. 4A and sampling network 80-2 in FIG. 4B).

As shown in FIG. 5, amplifier circuitry 110 may include transistors 120 and 124 coupled in series between supply voltage terminal 112 supplying voltage vsupply and ground voltage terminal supplying voltage vground. Transistors 122 and 126 may also be coupled in series between supply voltage terminal 112 and ground voltage terminal 114. Output terminals of amplifier circuitry 110 for differential signal voltages out_n and out_p may be provided between transistors 120 and 124, and between transistors 122 and 126, respectively. Transistors 120 and 122 may receive control signals vbp2.

Amplifier circuitry 110 may include a first set of transistors (e.g., transistors 132-1, 134-1, 136-1, and 138-1) configured to receive signals associated with a first sampling network such as sampling network 80-1 in FIG. 4A. Transistors 132-1 and 134-1 may receive as control signals, at respective gate terminals, signals vin1 and vip1 (e.g., from the output terminals of sampling network 80-1). Transistors 136-1 and 138-1 may receive as control signals, at respective gate terminals, the same signal vcascp1. Control signal vcascp1 may be used to enable the portion of amplifier circuitry 110 associated with the first sampling network. Amplifier circuitry 110 may therefore perform amplification operations for signals received from the first sampling network.

In the scenario where amplifier circuitry 110 performs amplification operations for signals received from sampling network 80-1 (e.g., when the first set of transistors is active, amplifier circuitry uses signals vin1 and vip1 to generate output signals out_n and out_p), output signals may be provided to sampling network 80-2 as inputs out_n and out_p in FIG. 4B.

Similarly, amplifier circuitry 110 may include a second set of transistors (e.g., transistors 132-2, 134-2, 136-2, and 138-2) configured to receive signals associated with a second sampling network such as sampling network 80-2 in FIG. 4B. Transistors 132-2 and 134-2 may receive as control signals, at respective gate terminals, signals vin2 and vip2 (e.g., from the output terminals of sampling network 80-2). Transistors 136-2 and 138-2 may receive as control signals, at respective gate terminals, the same signal vcascp2. Control signal vcascp2 may be used to enable the portion of amplifier circuitry 110 associated with the second sampling network. Amplifier circuitry 110 may therefore perform amplification operations for signals received from the second sampling network.

In the scenario where amplifier circuitry 110 performs amplification operations for signals received from sampling network 80-2 (e.g., when the second set of transistors is active, amplifier circuitry uses signals vin2 and vip2 to generate output signals out_n and out_p), output signals may be provided to sampling network 80-3 as inputs (e.g., inputs corresponding to signal(s) vout2 in FIG. 3).

Signals vin1 and vip1 may be referred to herein as a first input pair for amplifier circuitry 110 (e.g., an input pair from sampling network 80-1 in FIG. 4A). Signals vin2 and vip2 may be referred to herein as a second input pair for amplifier circuitry 110 (e.g., an input pair from sampling network 80-2 in FIG. 4). At least one of these two input pairs may always be connected to amplifier circuitry 110. As such, sampling circuitry 110 may continually performing amplifying operations either for sampling network 80-1 or for sampling network 80-2. By performing shared operations for two sampling networks in two different MDAC stages, dedicated amplifier circuitry for one of the sampling networks and MDAC stages may be omitted, thereby reducing power consumption and area usage.

Additionally, transistors 132-1 and 136-1, transistors 134-1 and 138-1, transistors 132-2 and 136-2, and transistors 134-2 and 138-2 may be implemented as four corresponding cascodes (e.g., two corresponding cascode devices, each for a different sampling network). By using cascode devices as the switching mechanism, the switching operations between input pairs may be less prone to error, since the switching is performed by changing one or more gates voltage of transistors 136-1, 138-1, 136-2, and 138-2. As an example, when the gate terminal of the cascode transistor (e.g., one of transistors 136-1, 138-1, 136-2, and 138-2) is at a supply voltage vsupply, the cascode transistor may be turned off. As another example, when the gate terminal of the cascode transistor is a cascode voltage vcascp, the cascode transistor may be turned on. Furthermore, since the sampled nodes of a sampling network (e.g., nodes supplying signals vin1 and vip1) may always connected to the corresponding input pair input (e.g., transistors 132-1 and 134-1), switching error is prevented. The use of cascode devices also avoids additional switch RC (resistor-capacitor) poles in the signal path and improves phase margin without increasing device load.

The first and second sets of transistors for the first and second sampling networks may be coupled between voltage terminals 112 and 114. In particular, transistors 116 and 118 may be coupled in parallel between the first set of transistors and voltage terminal 112 and may be coupled in parallel between the second set of transistors and voltage terminal 112. Transistor 116 may receive control signal vbiasp1 at its gate terminal. Transistor 118 may receive control signal vcmfb at its gate terminal.

Transistors 140 and 142 may be coupled in series between a portion of the first set of transistors (e.g., transistors 132-1 and 136-1) and voltage terminal 114 and may be coupled in series between a portion of the second set of transistors (e.g., transistors 132-2 and 136-2). Transistors 144 and 146 may be coupled in series between another portion of the first set of transistors (e.g., transistors 134-1 and 138-1) and may be coupled in series between another portion of the second set of transistors (e.g., transistors 134-2 and 138-2). Transistors 140 and 144 may receive the same control signal vcascn at their respective gate terminals. Transistors 142 and 146 may receive the same control signal vbiasn at their respective gate terminals.

Transistor 140 may have first and second source-drain terminals (a first one of the source or drain terminal and a second one of the other source or drain terminal). The first source-drain terminal of transistor 140 may be connected to the gate terminal of transistor 124. The second source-drain terminal of transistor 140 (connected to transistor 142) may be coupled (via capacitor 128) to the output terminal for voltage signal out_n. Similarly, transistor 144 may have first and second source-drain terminals. The first source-drain terminal of transistor 144 may be connected to the gate terminal of transistor 126. The second source-drain terminal of transistor 144 (connected to transistor 146) may be coupled (via capacitor 130) to the output terminal for voltage signal out_p.

As shown in FIG. 5, amplifier circuitry 110 may further include a switch 148 that selectively shorts (i.e., electrically connects) the output terminals of amplifier circuitry 110 for signals out_n and out_p and a switch 150 that selectively shorts the first source-drain terminal of transistor 140 to the first source-drain terminal of transistor 144. An output signal from logic AND gate 152 may be used to control both switches 148 and 150. Logic gate 152 may receive an inverted version of signal p1d and an inverted version of signal p2d as its two inputs.

Signals p1d and p2d are asserted during the amplification modes for the first sampling network and for the second sampling network, respectively. In other words, switches 148 and 150 may be activated (e.g., closed to form a conductive path) during the brief period of time during which both first and sampling networks are not in their respective amplification modes (e.g., between the amplification phase of the first sampling network and the amplification phase of the second sampling network, when comparator circuitry 66 in FIG. 3 is being used, etc.). As such, switches 148 and 150 may be configured to bring nodes for signals out_n and out_p to a common mode voltage in preparation for the subsequent sampling phase for the first or second sampling network. This may half the maximum slew swing for the subsequent amplification process, since settling may begin from the common mode voltage instead of the previous amplifier output. Since this common mode voltage shorting process is done between amplification phases, the available settling time for the amplification phase remains the same.

In the example of FIG. 5, transistors 116, 118, 120, 122, 132-1, 132-2, 134-1, 134-2, 136-1, 136-2, 138-1, and 138-2 may be PMOS transistors (p-type metal-oxide-semiconductor transistors), and transistors 124, 126, 140, 142, 144, and 146 may be NMOS transistors (n-type metal-oxide-semiconductor transistors). However, this example is merely illustrative. If desired, the types of transistors in amplifier circuitry 110 may be switched or implemented in any other suitable manner. Control signals and other configurations for these switched or changed transistor may be changed accordingly.

Figure 6:
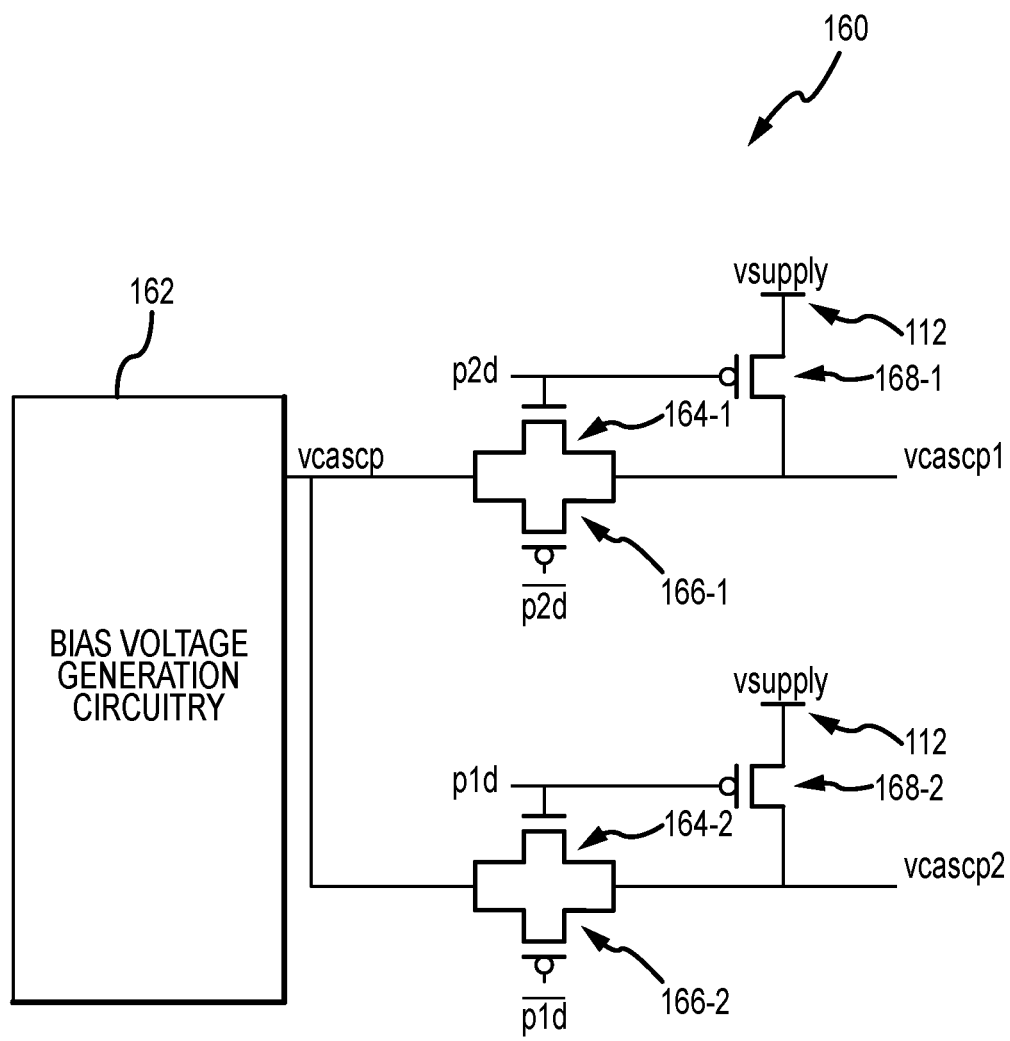
FIG. 6 is a diagram of illustrative control signal generation circuitry for cascodes such as cascodes of the type shown in FIG. 5 and for controlling the shared operations of amplifier circuitry such as amplifier circuitry of the type shown in FIG. 5 in accordance with some embodiments.

FIG. 6 is a diagram of illustrative control signal generation circuitry such as control signal generation circuitry for the cascode devices in amplifier circuitry 110 in FIG. 5. In particular, control signal generation circuitry 160 may include bias voltage generation circuitry 162. Bias voltage generation circuitry 162 may generate bias voltage vcascp. Voltage vcascp may be at a voltage level sufficient to turn on the cascode transistors (e.g., transistors 136-1, 138-1, 136-2, and 138-2 in FIG. 5). In particular, control signal generation circuitry 160 may be used to generate control signal vcascp1 and vcasp2, respectively for transistors 136-1 and 138-1 and for transistors 136-2 and 138-2. Control signals vcascp1 and vcascp2 may be generated based on voltages vcascp and vsupply.

In particular, transistor 164-1 and 166-1 may be coupled in parallel between bias voltage generation circuitry 162 (e.g., the signal path for signal vcascp generated by circuitry 162) and the output terminal of circuitry 160 for signal vcascp1. Transistor 168-1 may be coupled between supply voltage terminal 112 and the output terminal of circuitry 160 for signal vcascp1. Transistors 164-1 and 168-1 may receive the same control signal p2d at their respective gate terminals. Transistor 166-1 may receive an inverter version of control signal p2d at its gate terminal.

Transistors 164-2 and 166-2 may be coupled in parallel between bias voltage generation circuitry 162 (e.g., the signal path for signal vcascp generated by circuitry 162) and the output terminal of circuitry 160 for signal vcascp2. Transistor 168-2 may be coupled between supply voltage terminal 112 and the output terminal of circuitry 160 for signal vcascp2. Transistors 164-2 and 168-2 may receive the same control signal p1d at their respective gate terminals. Transistor 166-2 may receive an inverter version of control signal p1d at its gate terminal.

In the example of FIG. 6, transistors 166-1, 166-2, 168-1, and 168-2 may be PMOS transistors, and transistors 164-1 and 164-2 may be NMOS transistors. However, this example is merely illustrative. If desired, the types of transistors in control signal generation circuitry 160 may be switched or implemented in any other suitable manner. Control signals and other configurations for these switched or changed transistor may be changed accordingly.

Figure 7:
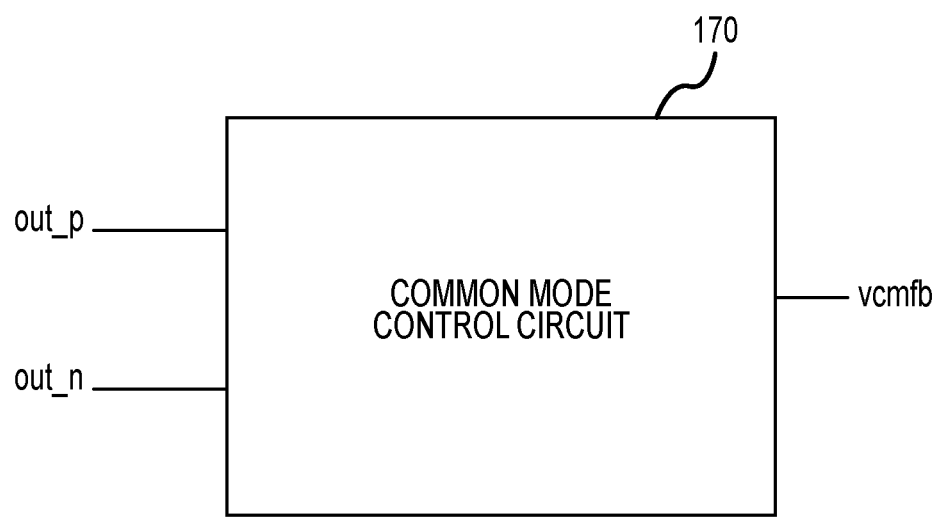
FIG. 7 is a diagram of an illustrative common mode control circuit in accordance with some embodiments.

FIG. 7 is a diagram of an illustrative common mode control circuit for generating control signal that may be used in amplifier circuitry 110. In particular, common mode control circuitry 170 may receive differential signal voltages out_n and out_p. Based on voltages out_n and out_p, common mode control circuitry 170 may generated control signal vcmfb for transistor 118 in FIG. 5 (as an example).

As described above in connection with switches 148 and 150 in FIG. 5, between amplification phases of the first and second sampling networks, the output terminals for signals out_p and out_n may be brought to a common mode voltage by shorting the output terminals to each other. During the amplification phases, the output terminals may slew to the amplified output voltages. Common mode control circuitry 170 may be use these behaviors of signals out_p and out_n to generate signal vcmfb, thereby controlling transistor 118 in a feedback path.

Figure 8:
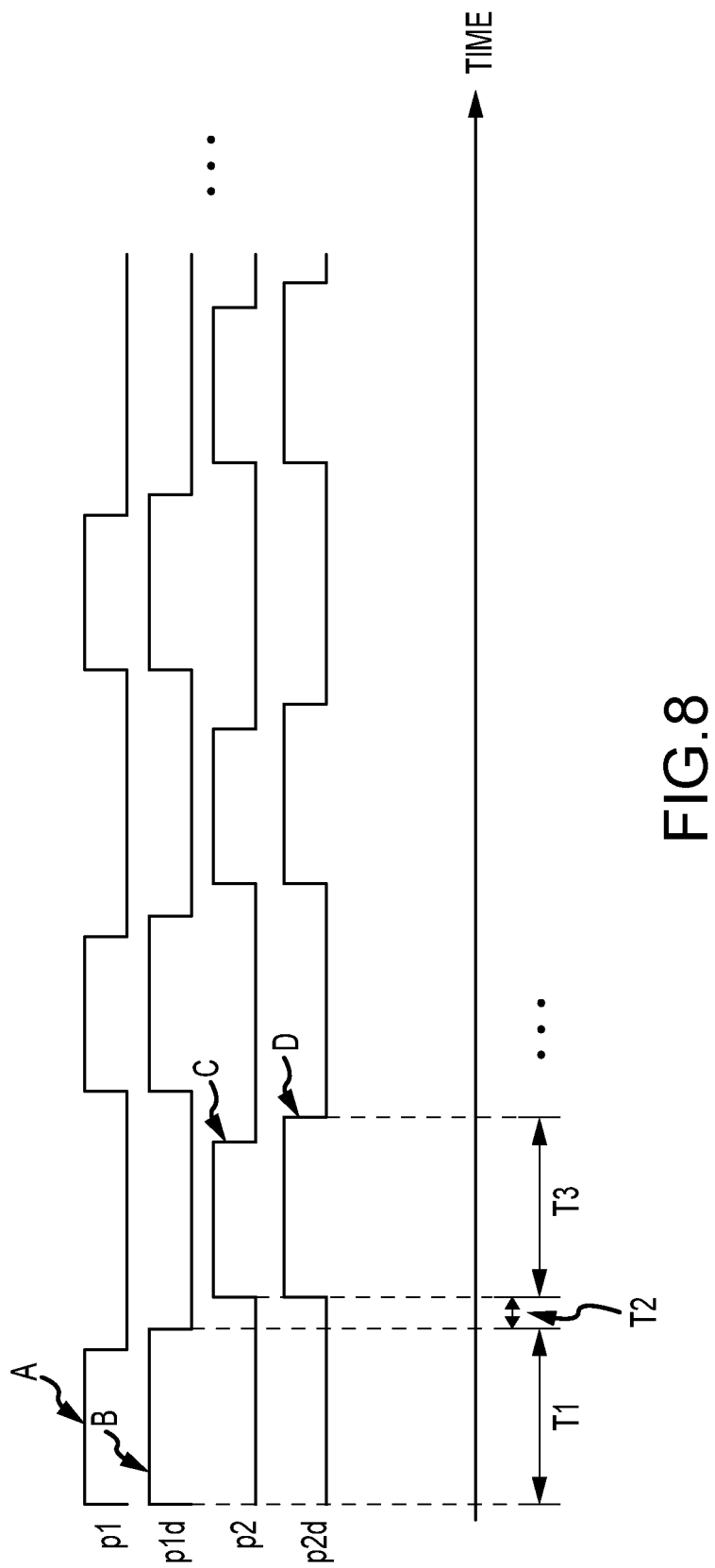
FIG. 8 is an illustrative timing diagram for operating shared amplifier circuitry in MDAC stages such as amplifier circuitry and/or MDAC stages described in connection with FIGS. 1-7 in accordance with some embodiments.

FIG. 8 is an illustrative timing diagram for operating ADC circuitry and more specification for operating amplifier circuitry in MDAC circuitry for two stages of the ADC circuitry. For illustrative purposes, the timing diagram is described with respect to one or more elements in FIGS. 3-7. If desired, the timing diagram in FIG. 8 may be used separately or in connection with other circuitry (e.g., other ADC circuitry implemented in the systems and circuitry in FIGS. 1 and 2).

In the example of FIG. 8, signals p1, p1d, p2, and p2d are shown. However, other signals may be used to operate the ADC circuitry as well. These other signals are omitted in order to not unnecessary obscure the embodiments described herein. As shown in FIG. 8, during time period T1, signals p1 and p1d may be asserted (e.g., assertions A and B) and signals p2 and p2d may be deasserted.

In particular, by asserting signal p1, switches 102-1, 104-1, and 106-1 in FIG. 4A may be closed to short output terminals vip1 and vin1 to voltage vcm_ota. By asserting signal p1d and deasserting signal p2d, output signal vcascp2 may be a voltage level vcascp and output signal vcascp1 may be at voltage level vsupply. Based on these voltage levels, transistors 136-2 and 138-2 may be activated (e.g., turned on) and transistors 136-1 and 138-1 may be deactivated (e.g., turned off). As such, time period T1 may be a sampling time period for sampling network 80-1 in FIG. 4A and an amplification time period for sampling network 80-2 in FIG. 4B (e.g., using amplifier circuitry 110 in FIG. 5).

In other words, during the sampling phase of network 80-1 (e.g., when signal p1 is asserted), input signal input_n is sampled on the left terminals (as shown in FIG. 4A) of corresponding capacitors 84-1n and 92-1n and input signal input_p is sampled on the left terminals (as shown in FIG. 4A) on corresponding capacitors 84-1p and 92-1p. The right terminals (as shown in FIG. 4A) of capacitors 84-1n, 92-1n, 84-1p, and 92-1p may be connected to voltage vcm_ota (e.g., via switches 102-1, 104-1, and 106-1). During these sampling operations, cascodes for sampling network 80-1 (e.g., transistors 136-1 and 138-1) may be turned off. At the same time, cascodes for sampling network 80-2 (e.g., transistors 136-2 and 138-2) may be turned on, and amplifier circuitry 110 may be configured to generate amplified outputs for sampling network 80-2 (e.g., based on signals vip2 and vin2).

Time period T2 may follow time period T1. During time period T2, signals p1, p1d, p2, and p2d may all be deasserted. This may constitute a time period between the sampling and amplification operations of MDAC circuitry (e.g., MDC circuitry 64 in FIG. 3) and may be allotted for comparison circuitry (e.g., comparison circuitry 66 in FIG. 3) to perform comparison operations to generate a comparison result signal. As described in connection with FIG. 3, during time period T2, output nodes out_p and out_n in amplifier circuitry (e.g., amplifier circuitry 110) may brought to the common mode voltage (using switches 148 and 150).

As further shown in FIG. 8, during time period T3, signals p2 and p2d may be asserted (e.g., assertions C and D) and signals p1 and p1d may be deasserted.

In particular, by asserting signal p2, switches 102-2, 104-2, and 106-2 in FIG. 4B may be closed to short output terminals vip2 and vin2 to voltage vcm_ota. By asserting signal p2d and deasserting signal p1d, output signal vcascp1 may be a voltage level vsupply and output signal vcascp2 may be at voltage level vcascp. Based on these voltage levels, transistors 136-1 and 138-1 may be activated (e.g., turned on) and transistors 136-2 and 138-2 may be deactivated (e.g., turned off). As such, time period T3 may be a sampling time period for sampling network 80-2 in FIG. 4B and an amplification time period for sampling network 80-1 in FIG. 4A (e.g., using amplifier circuitry 110 in FIG. 5).

In other words, during the sampling phase of network 80-2 (e.g., when signal p2 is asserted), input signal out_n is sampled on the left terminals (as shown in FIG. 4B) of corresponding capacitors 84-2n and 92-2n and input signal out_p is sampled on the left terminals (as shown in FIG. 4B) on corresponding capacitors 84-2p and 92-2p. The right terminals (as shown in FIG. 4B) of capacitors 84-2n, 92-2n, 84-2p, and 92-2p may be connected to voltage vcm_ota (e.g., via switches 102-2, 104-2, and 106-2). During these sampling operations, cascodes for sampling network 80-2 (e.g., transistors 136-2 and 138-2) may be turned off. At the same time, cascodes for sampling network 80-1 (e.g., transistors 136-1 and 138-1) may be turned on, and amplifier circuitry 110 may be configured to generate amplified outputs for sampling network 80-1 (e.g., based on signals vip1 and vin1).

Operation may continue in an analogous manner following time period T3. As an example, a time period analogous to time period T2 may follow time period T3, and subsequent to that analogous time period, operations may repeat with time periods analogous to time periods T1, T2, and T3.

One or more embodiments may be directed to a pipeline ADC. The pipeline ADC may have multiple MDAC stages working in opposite phases: a sampling phase and an amplification phase. Effectively, an OTA (e.g., amplifier circuitry) may only be useful in the amplification phase. The main power consumption in pipeline ADC design may be the use of the MDAC OTA in performing residue amplification. To save power, it may be possible to power down OTA in the sampling phase. However, this may add dead time while powering up the OTA and may reduce the available settling time, and hence push the design requirement higher, thereby leading to reduced power savings. Another technique may be to put switches on the gates of the input pair and have a resetting of the summing (input) nodes before connecting the sampled capacitors (in the corresponding sampling network). However, this may add complexity in the design in order to make sure the summing nodes are reset properly in a very short amount of available time.

The embodiments described herein may use two input pairs, where each input pair may be always connected to its corresponding sampling network. In particular, the amplifier circuitry may be shared by two sampling networks. The embodiments described herein may use cascode devices as switches as shown in FIGS. 5 and 6. The gate of each cascode may be connected to a supply (voltage) level for turning-off and may be connected to vcascp (a bias voltage level) for turning-on.

By using this design, higher performance can be achieved. In particular, the OTA shown in FIG. 5 may be less prone to the errors due to switchover of input pairs, since switching may be carried out by changing the gate voltage of cascode devices. Additionally, since the sampled node may always be connected to its input pair, there may be no switching errors on the sampled value of the amplifier inputs.

Additionally, by using this design, higher operating speed can be obtained. In particular, the use of the cascode as a switch may avoid any additional switch RC pole in the signal path. As such, phase margins may be improved. Furthermore, the use of the cascode as a switch does not increase the device load.

The embodiments described herein may use two input pairs respective coupled to two switch capacitor networks (e.g., sampling networks), and use the cascodes as switches.

When operating the OTA, the amplifier circuitry may always be performing amplification operations (with the exception of the small non-overlap time). During the small clock non-overlap time where comparators are making decision for the MDAC stage, the MDAC OTA output nodes may be brought to the common mode very quickly with a shorting switch. This may reduce the maximum slew swing to half since settling always begins from common mode. In other words, amplifier output swing starts from the common mode and not from previous output levels. Additionally, this may be done in non-overlap time, and therefore, available settling time is still the same and unaffected, thereby keeping the design optimum for power.

In accordance with some embodiments, the OTA may be used during both the amplification phases for the two MDAC stages of a pipeline ADC as described above.

In accordance with some embodiments, by using cascodes as switches as described herein, it may be possible to achieve a higher gain without affecting the speed performance, since there are no additional nodes/poles compared to adding switches. Additionally, the cascode gate may be kept at a bias level when it is turned on, and the cascode gate may be kept at a supply level to turn it off since it is PMOS device.

In accordance with some embodiments, by providing a shorting switch timed to turn on during non-overlap time allotted for comparator decision helps the amplifier output to settle faster for high speed design.

In accordance with some embodiments, the amplifier circuitry may have an additional set of input pair devices, and tail current may be steered to one of the pairs by turning the corresponding cascodes on and off.

The foregoing is merely illustrative of the principles of this invention and various modifications can be made by those skilled in the art. The foregoing embodiments may be implemented individually or in any combination.

What is claimed is:

1. An object detection system comprising:
 analog-to-digital converter circuitry that includes:
  first and second stages, each of the first and second stages having comparator circuitry and a sampling network, and
  amplifier circuitry shared by the first and second stages, having a first portion that includes a first cascode device, and having a second portion that includes a second cascode device, wherein the sampling network of the first stage is coupled to the first cascode device and the sampling network of the second stage is coupled to the second cascode device.

2. The object detection system defined in claim 1, wherein the first cascode device includes a first transistor that receives a cascode control signal and the sampling network of the first stage is connected to a second transistor, the first and second transistors being connected in series.

3. The object detection system defined in claim 2, wherein the second cascode device includes a third transistor that receives an additional cascode control signal and the sampling network of the second stage is connected to a fourth transistor, the third and fourth transistors being connected in series.

4. The object detection system defined in claim 3, wherein the sampling network of the first stage is connected to a gate terminal of the second transistor and the sampling network of the second stage is connected to a gate terminal of the fourth transistor.

5. The object detection system defined in claim 1, wherein the first portion of the amplifier circuitry includes four transistors and the second portion of the amplifier circuitry includes four transistors.

6. The object detection system defined in claim 5, wherein two of the four transistors in the first portion of the amplifier circuitry receive a same first cascode control signal and two of the four transistors in the second portion of the amplifier circuitry receive a same second cascode control signal.

7. The object detection system defined in claim 6, further comprising:
 control signal generation circuitry configured to generate the first and second cascode control signals based on a supply voltage level and a bias voltage level.

8. The object detection system defined in claim 7, wherein the first cascode control signal is configured to be at one of the supply voltage level or the bias voltage level while the second cascode control signal is at the other one of the supply voltage level or the bias voltage level.

9. The object detection system defined in claim 1, wherein the amplifier circuitry includes first and second output terminals, wherein the amplifier circuitry is configured to generate amplified outputs for the sampling network of the first stage at the first and second output terminals in a first mode of operation and is configured to generate amplified outputs for the sampling network of the second stage at the first and second output terminals in a second mode of operation.

10. The object detection system defined in claim 9, wherein the first output terminal is coupled to the second output terminal by a switch.

11. The object detection system defined in claim 9, wherein the amplifier circuitry includes a transistor that couples the first and second portions of the amplifier circuitry to a supply voltage terminal.

12. The object detection system defined in claim 11, wherein the transistor receives a control signal, and a common mode control circuit is configured to generate the control signal based on corresponding signals at the first and second output terminals.

13. A system comprising:
 analog circuitry;
 digital circuitry; and
 analog-to-digital converter circuitry connecting the analog circuitry to the digital circuitry, the analog-to-digital converter circuitry comprising:
  a plurality of stages coupled in series, at least first and second stages in the plurality of stages including amplifier circuitry shared by the first and second stages, wherein the amplifier circuitry includes first and second transistors connected in series, the first transistor configured to receive, at a gate terminal of the first transistor, a signal from a portion of the first stage, and wherein the amplifier circuitry includes third and fourth transistors connected in series, the third transistor configured to receive, at a gate terminal of the third transistor, a signal from a portion of the second stage.

14. The system defined in claim 13, wherein the amplifier circuitry includes fifth and sixth transistors connected in series, the fifth transistor configured to receive an additional signal from the portion of the first stage at a gate terminal of the fifth transistor.

15. The system defined in claim 14, wherein the amplifier circuitry includes seventh and eighth transistors connected in series, the seventh transistor configure to receive an additional signal from the portion of the second stage at a gate terminal of the seventh transistor.

16. The system defined in claim 15, wherein the first and second transistors form a first pair of transistors, the third and fourth transistors form a second pair of transistors, the fifth and sixth transistors form a third pair of transistors, the seventh and eighth transistors form a fourth pair of transistors, the first pair of transistors and the second pair of transistors are connected in parallel between a ground voltage terminal and a supply voltage terminal, and the third pair of transistors and the fourth pair of transistors are connected in parallel between the ground voltage terminal and the supply voltage terminal.

17. The system defined in claim 13, wherein the amplifier circuitry is configured to generate an output signal based on the signal from the portion of the first stage during a first time period and is configured to generate the output signal based on the signal from the portion of the second stage during a second time period, and wherein the first and second time periods are temporally nonoverlapping.

18. Amplifier circuitry comprising:
 first and second pairs of inputs;
 a supply voltage terminal;
 a ground voltage terminal;
 first and second cascode devices, each formed from four transistors, wherein first and second transistors in the first cascode device receive the first pair of inputs at corresponding gate terminals of the first and second transistors, wherein third and fourth transistors in the second cascode device receive the second pair of inputs at corresponding gate terminals of the third and fourth transistors, and wherein the first and second cascode devices are coupled between the supply and ground voltage terminals; and a pair of outputs configured to generate corresponding output signals based on one of the first or second pairs of inputs.

19. The amplifier circuitry defined in claim 18 further comprising:
a switch that connects a first output in the pair of outputs to a second output in the pair of outputs.

20. The amplifier circuitry defined in claim 19 further comprising:
an additional transistor that couples the first and second cascode devices to the supply voltage terminal, wherein the additional transistor receives a control signal generated based on the output signals.

* * * * *